(12) United States Patent
Wang et al.

(10) Patent No.: US 11,545,518 B2
(45) Date of Patent: Jan. 3, 2023

(54) IMAGE SENSOR AND METHOD FOR FABRICATING THE SAME

(71) Applicant: TAIWAN SEMICONDUCTOR MANUFACTURING CO., LTD., Hsinchu (TW)

(72) Inventors: Chiao-Chi Wang, Taoyuan (TW); Chung-Chuan Tseng, Hsinchu (TW); Chia-Ping Lai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 196 days.

(21) Appl. No.: 16/990,244

(22) Filed: Aug. 11, 2020

(65) Prior Publication Data
US 2022/0052105 A1 Feb. 17, 2022

(51) Int. Cl.
*H01L 21/20* (2006.01)
*H01L 27/146* (2006.01)

(52) U.S. Cl.
CPC .. *H01L 27/14683* (2013.01); *H01L 27/14636* (2013.01)

(58) Field of Classification Search
CPC ................. H01L 27/146; H01L 27/148; H01L 27/14603; H01L 27/14636; H01L 27/14683; H01L 27/14625; H01L 27/14629; H01L 27/14893
USPC ........................................ 438/478, 481, 492
See application file for complete search history.

(56) References Cited

U.S. PATENT DOCUMENTS

| | | | |
|---|---|---|---|
| 10,923,614 B2* | 2/2021 | Sakata | H01L 27/14636 |
| 11,101,315 B2* | 8/2021 | Fujii | H01L 31/022408 |
| 2021/0134557 A1* | 5/2021 | Wang | H01J 37/244 |

* cited by examiner

*Primary Examiner* — Chuong A Luu
(74) *Attorney, Agent, or Firm* — Birch, Stewart, Kolasch & Birch, LLP

(57) ABSTRACT

A method for fabricating an image sensor is described which includes forming an insulating layer on a semiconductor substrate and forming a recess in the semiconductor substrate and the insulating layer. An epitaxial structure is grown in the recess. A first polish treatment is then performed to the insulating layer and the epitaxial structure. The insulating layer is detected to obtain a signal intensity, and the signal intensity increases as a thickness of the insulating layer decreases. The first polish treatment stops when the signal intensity reaches a target value.

20 Claims, 9 Drawing Sheets

IMAGE SENSOR AND METHOD FOR FABRICATING THE SAME

BACKGROUND

An image sensor may be used to detect optical signals and convert the optical signals to electrical signals that may be further processed by another circuitry. Photodiodes may be used in consumer electronics products, image sensors, data communications, time-of-flight (TOF) applications, medical devices, and many other suitable applications.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
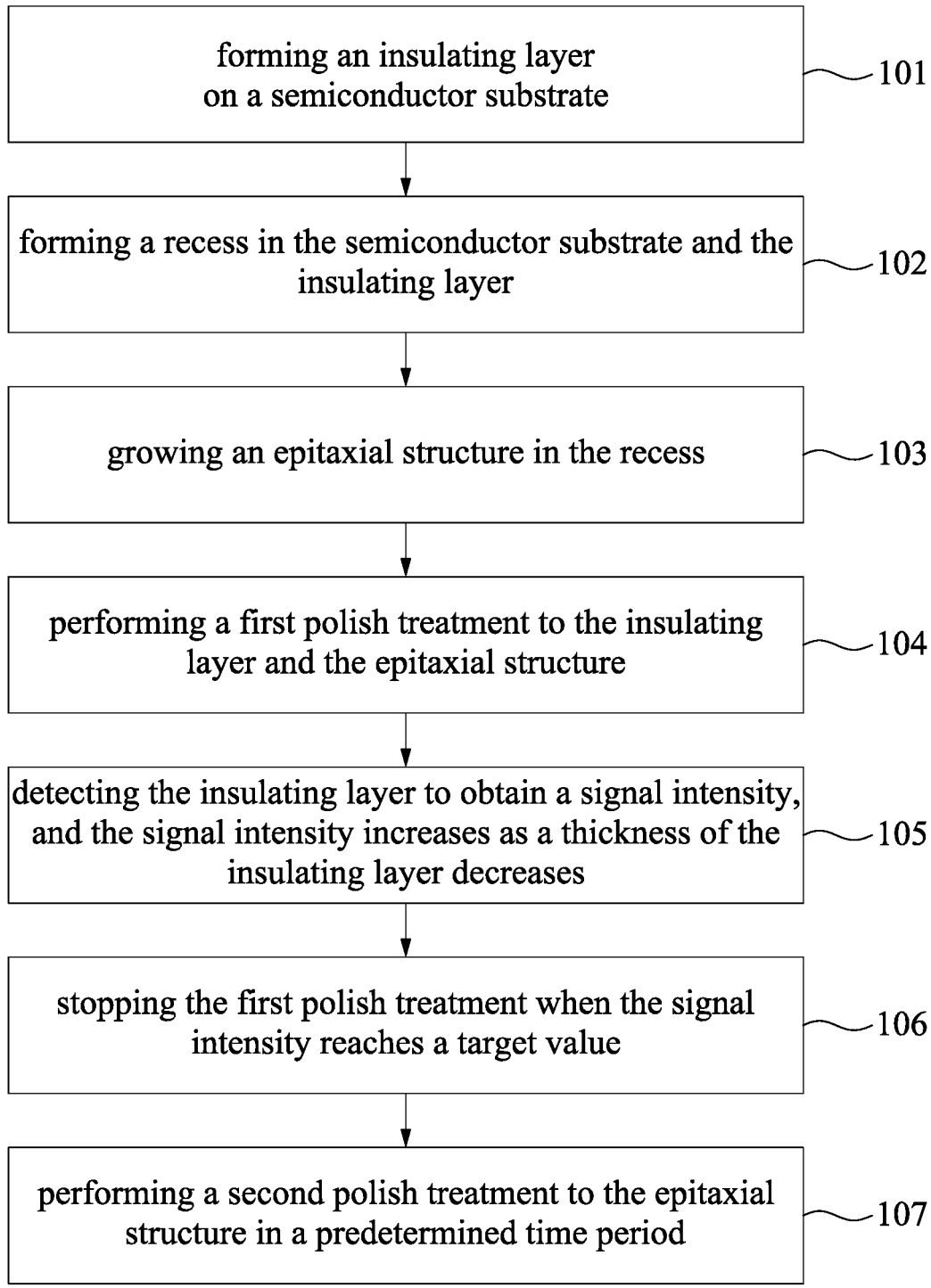
FIG. 1 is a flowchart of a method for fabricating an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In time-of-flight (TOF) applications, a phase difference between a transmitted light pulse and a detected light pulse is used to determine depth information of a three-dimensional object. In some embodiments, time-of-flight applications use light sources having wavelengths in the near-infrared (NIR) range. For example, a light-emitting-diode (LED) may have a wavelength of 850 nm, 940 nm, 1050 nm, or 1310 nm. Silicon is used as an image sensor material, but silicon has a low optical absorption efficiency for wavelengths in the near-infrared (NIR) spectrum or longer. Other materials and/or material alloys such as germanium and germanium-silicon may be used as image sensor materials with innovative optical device structure design described in this specification.

FIG. 1 is a flowchart of a method 100 for fabricating an image sensor in accordance with some embodiments of the present disclosure. The method 100 begins with Step 101 in which an insulating layer is formed on a semiconductor substrate. The method 100 continues with Step 102 in which a recess is formed in the semiconductor substrate and the insulating layer. The method 100 continues with Step 103 in which an epitaxial structure is grown in the recess. The method 100 continues with Step 104 in which a first polish treatment is performed to the insulating layer and the epitaxial structure. The method 100 continues with Step 105 in which a thickness of the insulating layer is detected to obtain a signal intensity, and the signal intensity increases as a thickness of the insulating layer decreases. The method 100 continues with Step 106 in which the first polish treatment stops when the signal intensity reaches a target value, such that a first end point detection is performed. The method 100 continues with selectable Step 107 in which a second polish treatment is performed to the epitaxial structure in a predetermined time period, such that a second end point detection using time mode is performed. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2A:
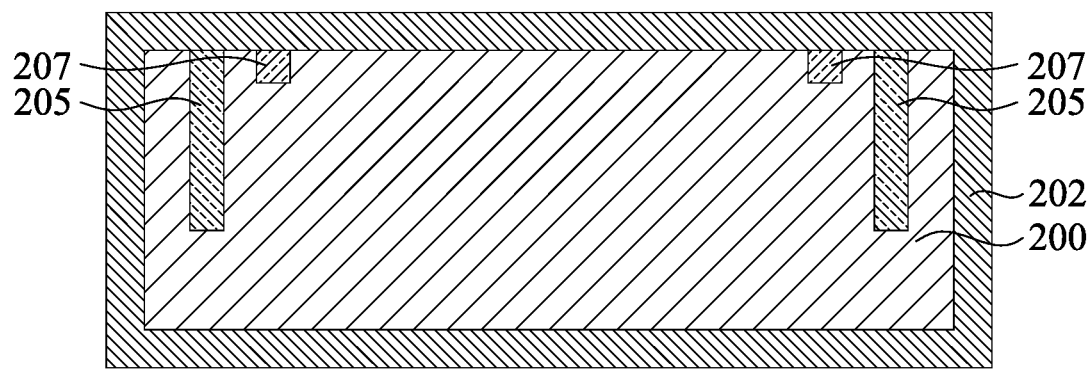
FIGS. 2A-2L are cross-sectional views of intermediate stages of a method for fabricating an image sensor in accordance with some embodiments of the present disclosure.

FIGS. 2A-2L are cross-sectional views of intermediate stages of a method for fabricating an image sensor in accordance with some embodiments of the present disclosure. FIG. 2A through FIG. 2L diagrammatically illustrate a method of performing at least one polish treatment to an epitaxial structure. FIG. 2A illustrates the details about Step 101 of FIG. 1. Referring to FIG. 2A and Step 101, an insulating layer 202 is formed on a semiconductor substrate 200 to cover the semiconductor substrate 200. Before the insulating layer 202 is formed on the semiconductor substrate 200, p-wells 205 and n-wells 207 are formed in the semiconductor substrate 200. In some embodiments, the n-wells 207 are formed between the p-wells 205. Specifically, the p-wells 205 are deeper than the n-wells 207 in the semiconductor substrate 200. The semiconductor substrate 200 can be a semiconductor crystalline substrate, such as a silicon substrate. In some embodiments, a thickness of the insulating layer 202 is about 750 Å. The insulating layer 202 is comprised of any suitable material, which is an oxide or a nitride of a semiconductor material, such as $SiO_2$ or $SiN_X$. Embodiments of the present disclosure are not limited in this regard, and other suitable materials may also be applicable, such as an oxide or a nitride of a metal element, a metal alloy, or a ceramic material. In some embodiments, the insulating layer 202 is formed by using a deposition process such as, for example, chemical vapor deposition (CVD), plasma enhanced chemical vapor deposition CVD (PECVD), physical vapor deposition (PVD), or other suitable deposition processes. The p-wells 205 are doped with P-type dopants such as boron, and the n-wells 207 are doped with N-type dopants such as arsenic or phosphorous.

Figure 2B:
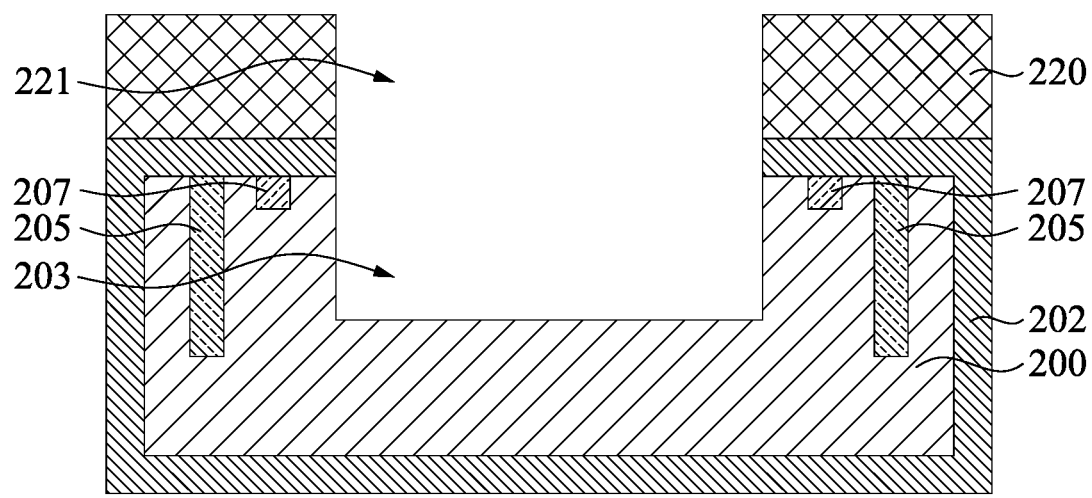
Figure 2C:
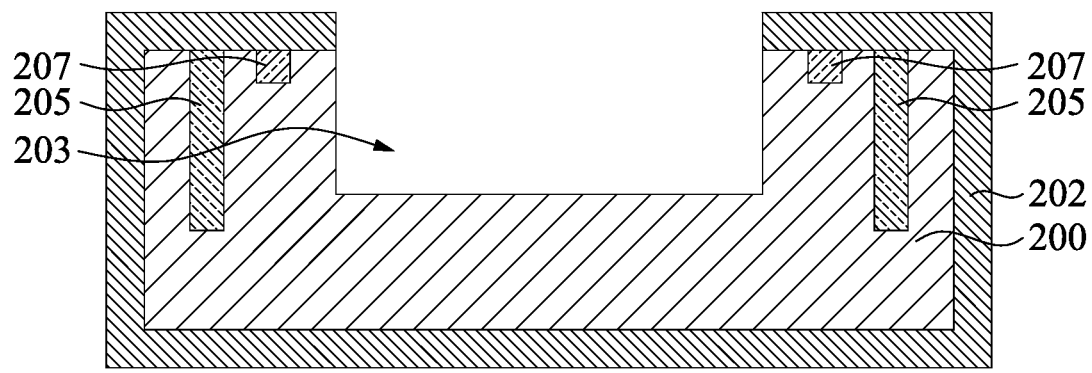

In accordance with some embodiments of the present disclosure, FIG. 2A through FIG. 2C can diagrammatically illustrate Step 102 of FIG. 1. Referring to FIG. 2A and FIG. 2B, a photoresist layer 220, such as a positive photoresist layer or a negative photoresist layer, is formed over the insulating layer 202 on the semiconductor substrate 200. A patterned mask (not shown) is then applied to cover some regions of the photoresist layer 220 to block light, so that the uncover regions of the photoresist layer 220 will be exposed to light. A solvent is then applied to the photoresist layer 220 in order to remove the cover regions or the uncover regions of the photoresist layer 220. In the case of using the positive photoresist layer, the uncover region of the photoresist layer 220 is degraded and dissolved away. In the case of using the negative photoresist layer, the uncover region of the photoresist layer 220 is strengthened by the light, and the solvent dissolves the covered region of the photoresist layer 220 away. Through the aforementioned methods, the photoresist layer 220 can be patterned to selectively form an opening 221 between the n-wells 207. Specifically, the patterned photoresist layer 220 includes the opening 221 that exposes a portion of the insulating layer 202 over the semiconductor substrate 200. An example photolithography patterning process can include soft baking of the photoresist layer 220, mask aligning, exposure, post-exposure baking, developing the photoresist layer 220, rinsing, and drying (e.g., hard baking).

Referring to FIG. 2B and FIG. 2C, a recess 203 is formed in the semiconductor substrate 200 and the insulating layer 202 using the patterned photoresist layer 220 as a mask. A depth of the recess 203 is about 2.3 ii m. The recess 203 can be formed by performing an etching process to remove portions of the semiconductor substrate 200 and the insulating layer 202 below the opening 221 of the photoresist layer 220. In other words, the removed portions of the semiconductor substrate 200 and the insulating layer 202 are not cover by the patterned photoresist layer 220. The etching process may be an anisotropic etching process, such as a dry etching process, or an isotropic etching process, such as a wet etching process. Embodiments of the present disclosure are not limited in this regard, and any suitable removal process may be applied herein. Furthermore, the photoresist layer 220 is removed after the recess 203 is formed. In some embodiments, after the formation of the recess 203, the recess 203 has an angle θ (shown in FIG. 2F) between a sidewall of the recess 203 and a horizontal line. In some embodiments, the angle θ is in a range from about 70 degrees to about 90 degrees. Stated differently, an obtuse angle or a right angle is between the sidewall and a bottom surface of the recess 203.

In some embodiments, the dry etching process includes a reactive ion etch (RIE) or a plasma etch. Furthermore, the dry etch process is implemented by fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., $HBr$ and/or $CHBr_3$), oxygen-containing gas, iodine-containing gas, other suitable gases and/or plasmas, or combinations thereof.

In some embodiments, the wet etching process uses, for example, at least one aqueous etch solution including citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), tetramethylammonium hydroxide (TMAH), or a combination thereof.

Figure 2D:
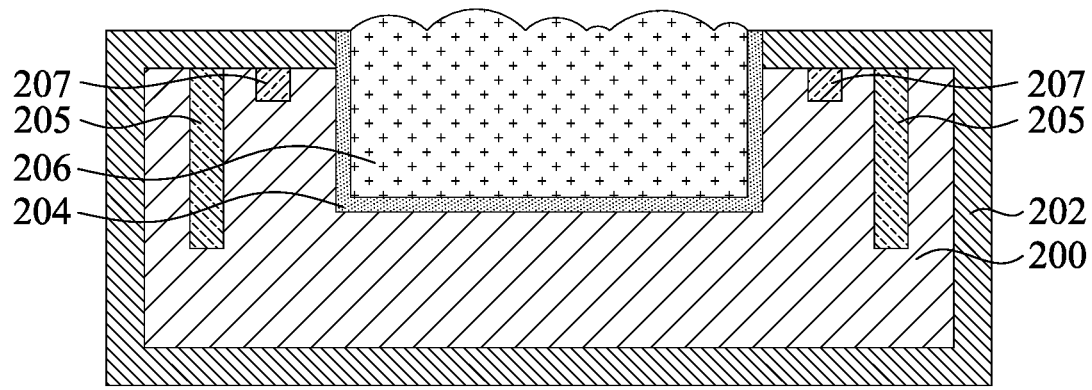

In accordance with some embodiments of the present disclosure, FIG. 2C and FIG. 2D can diagrammatically illustrate Step 103 of FIG. 1. Referring to FIG. 2C and FIG. 2D, an epitaxial structure 206 is grown in the recess 203 (shown in FIG. 2C). Moreover, a buffer layer 204 can be formed on a bottom surface and a sidewall of the recess 203 prior to the formation of the epitaxial structure 206. As a result, the buffer layer 204 is between the epitaxial structure 206 and the semiconductor substrate 200, so as to prevent dislocations on the interface between the semiconductor substrate 200 and the epitaxial structure 206. The epitaxial structure 206 is grown on the buffer layer 204 after the formation of the buffer layer 204. In some embodiments, the epitaxial structure 206 includes a germanium-based light absorption material.

Specifically, the germanium-based light absorption material can be intrinsic germanium or an alloy of elements including germanium, and the buffer layer 204 can include silicon germanium (SiGe), silicon carbon (SiC), or other suitable materials. In addition, growing the epitaxial structure 206 is performed such that a top surface of the epitaxial structure 206 may be higher than a top surface of the insulating layer 202.

In some embodiments, the epitaxial structure 206 can be grown by a selective epitaxial growth technique, such as a metal-organic vapor phase epitaxy (MOVPE) technique, a molecular beam epitaxy (MBE) technique, a hydride vapor phase epitaxy (HVPE) technique, liquid-phase epitaxy (LPE), metalorganic molecular beam epitaxy (MOMBE), or the combination thereof. In addition, the buffer layer 204 can be grown by a MBE technique, an atomic layer deposition (ALD) technique, a CVD technique or any suitable technique.

Figure 2E:
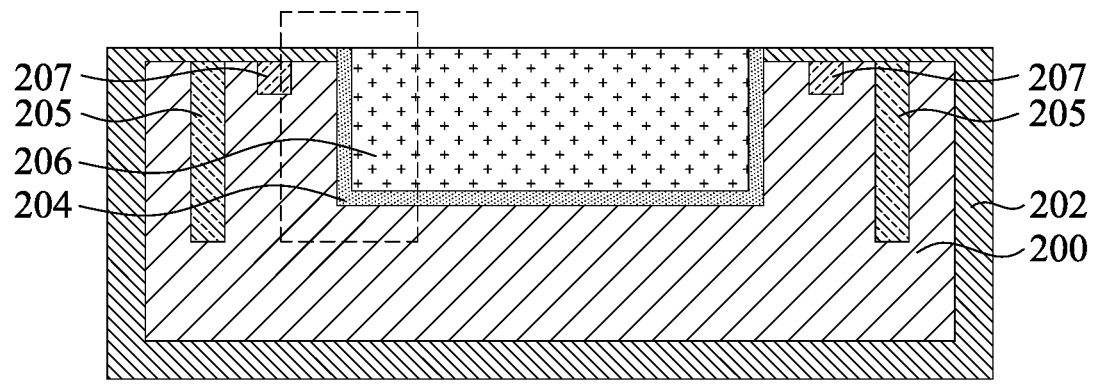
Figure 2F:
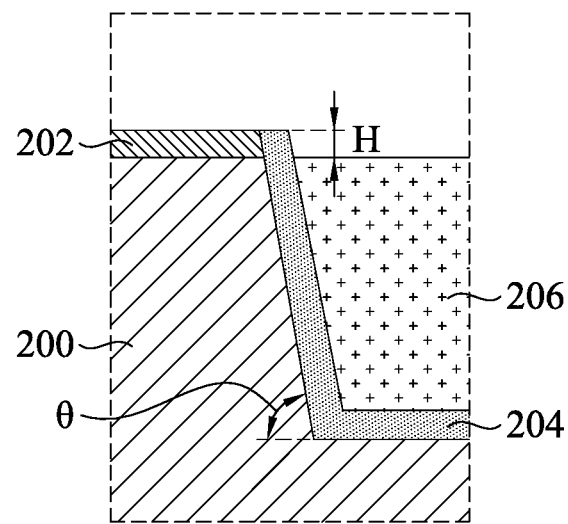

In accordance with some embodiments of the present disclosure, FIG. 2D to FIG. 2F can diagrammatically illustrate Step 104, Step 105, and Step 106 of FIG. 1. Referring to FIG. 2D and FIG. 2E, a first polish treatment is performed to the insulating layer 202 and the epitaxial structure 206 with the first end point detection. The thickness of the insulating layer 202 is detected to obtain a signal intensity which is related to the thickness of the insulating layer 202 and the epitaxial structure 206. Furthermore, the signal intensity increases as a thickness of the insulating layer 202 decreases, and the first polish treatment stops when the signal intensity reaches a target value corresponding to the desired thickness of the insulating layer 202 and the epitaxial structure 206, thereby acquiring the desired thickness of the insulating layer 202 and the epitaxial structure 206. In some embodiments, the thickness of the insulating layer 202 is equal to or less than 380 Å after performing the first polish treatment. The first treatment can be a chemical mechanical polishing (CMP) treatment, but embodiments of the present disclosure are not limited in this respect.

FIG. 2F is a partially enlarged view of a region (surrounded by a dotted line) of FIG. 2E. Referring from FIG. 2D to FIG. 2F, in some embodiments, a sensor can be used to detect the thicknesses of insulating layer 202 and the epitaxial structure 206 for the signal intensity thereof. Specifically, the sensor can be a light sensor, an electrical sensor, an impedance resonance sensor, or any suitable sensor that can detect the signal intensity of the thicknesses of the insulating layer 202 and the epitaxial structure 206, and embodiments of the present disclosure are not limited in this respect. In some other embodiments, the sensor solely detects the signal of the insulating layer 202 to obtain the signal intensity thereof. In some embodiments, a processor such as a central processing unit is connected to the sensor and a CMP tool which performs the first polish treatment, such that the processor can compare the obtained signal intensity of the insulating layer 202 and the epitaxial structure 206 with the target value to instruct the first polish treatment stop at a right time in order to control a step height H between a top surface of the insulating layer 202 and a top surface of the epitaxial structure 206. After the first polish treatment, the step height H between the top surface of the insulating layer 202 and the top surface of the epitaxial structure 206 can be smaller than 100 Å, such as in a range from about 0 Å to about 60 Å, such that the top surface of the epitaxial structure 206 is substantially coplanar with the top surface of the insulating layer 202. Moreover, kill defects over the insulating layer 202 and the epitaxial structure 206 can be prevented. Specifically, a thickness of the insulating layer 202 smaller than about 20 Å can be removed during the first polish treatment. In addition, an angle between a bottom surface and a sidewall of the epitaxial structure 206 is in a range from about 90 degrees to about 110 degrees since the recess 203 (shown in FIG. 2C) has an angle θ in a range from about 70 degrees to about 90 degrees.

After Step 106 of FIG. 1 is performed, the method 100 can continues with selectable Step 107 of FIG. 1. In accordance with some embodiments of the present disclosure, a second polish treatment is optionally performed to the epitaxial structure 206 with the second end point detection according to a predetermined time period, so as to increase the step height H between the top surface of the insulating layer 202 and the top surface of the epitaxial structure 206 to be in a range from about 40 Å to about 100 Å, thereby further preventing kill defect over the insulating layer 202 and the epitaxial structure 206. Since polish time is relevant to the removed thickness of the epitaxial structure 206, the desired step height H can be obtained by adjusting polish time of the second polish treatment. Such method is referred to as the control of end point mode with over polish time. Specifically, the second polish treatment can also be a CMP treatment.

Figure 2G:
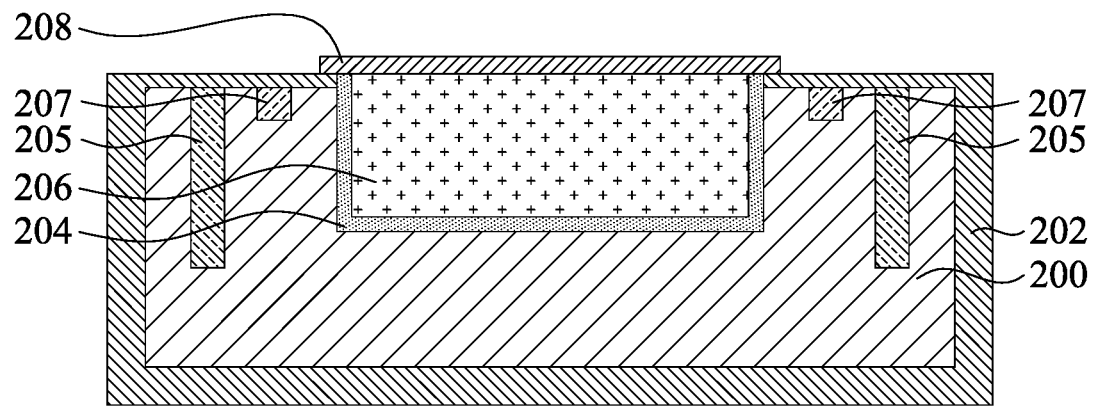

FIG. 2E and FIG. 2G are cross-sectional views of intermediate stages of a method for fabricating an image sensor in accordance with some embodiments of the present disclosure. Referring to FIG. 2E and FIG. 2G, a capping layer 208 is formed over the insulating layer 202 and the epitaxial structure 206. A thickness of the capping layer 208 is equal to or less than 300 Å, and the capping layer 208 can include a silicon-based material. Specifically, the silicon-based material can be intrinsic silicon, such as pure silicon or substantially pure silicon, or an alloy including silicon. The capping layer 208 can be formed by using a selective epitaxial growth technique, such as a metal-organic vapor phase epitaxy (MOVPE) technique, a molecular beam epitaxy (MBE) technique, a hydride vapor phase epitaxy (HYPE) technique, liquid-phase epitaxy (LPE), metalorganic molecular beam epitaxy (MOMBE), or the combination thereof, and embodiments of the present disclosure are not limited in this respect. As a result of such a configuration, the capping layer 208 can cover and protect the epitaxial structure 206.

Figure 2H:
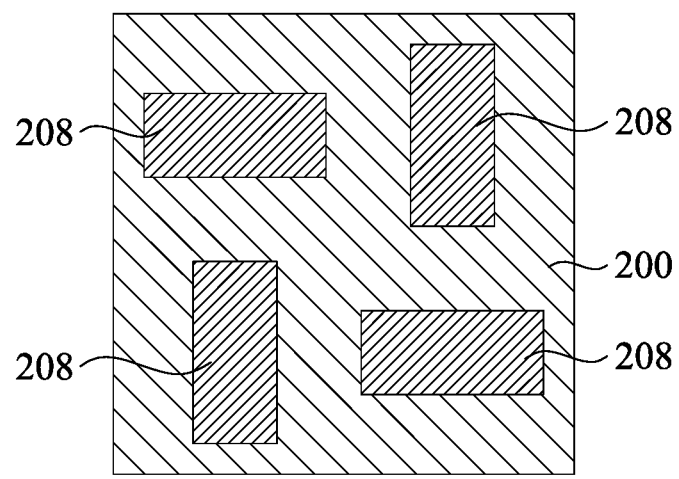
Figure 2I:
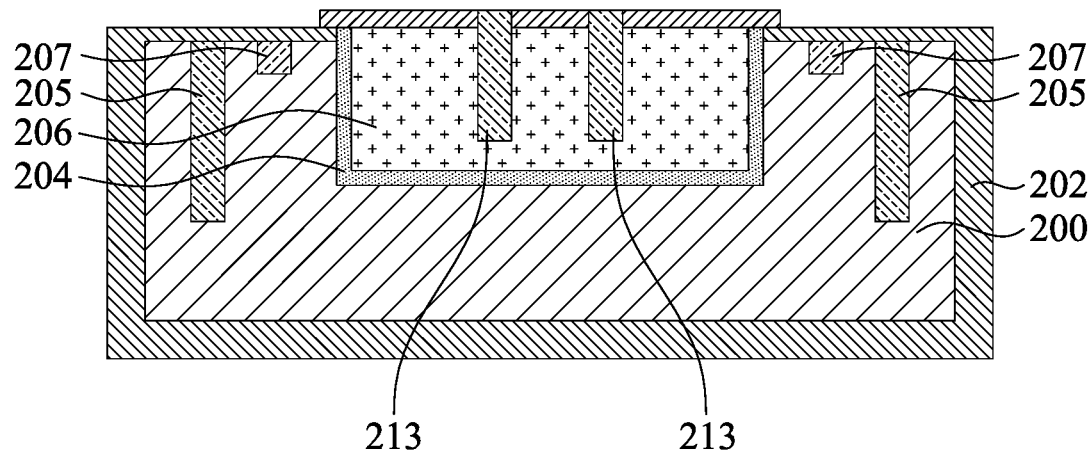
Figure 2J:
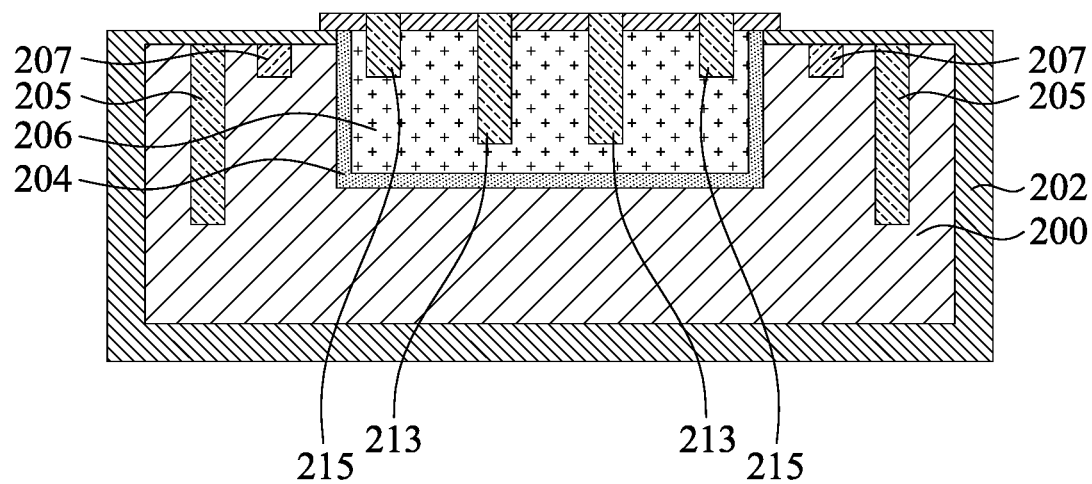

Referring to FIG. 2G and FIG. 2H, FIG. 2H is a top view of an intermediate stage for fabricating the image sensor in FIG. 2G. In some embodiments, the image sensor may include a plurality of the capping layers 208 and the underlying epitaxial structures 206. In other words, the capping layers 208 respectively cover the epitaxial structures 206. Furthermore, portions of the capping layers 208 extend onto the insulating layer 202. In some embodiments, the capping layers 208 are substantially rectangles when viewed from above, and a lengthwise direction of one of the capping layers 208 is vertical to a lengthwise direction of another capping layer 208. The skilled in this art can adjust the shape and relative positions of the capping layers 208 based on their desired configuration, so embodiments of the present disclosure are not limited in this respect.

Figure 2K:
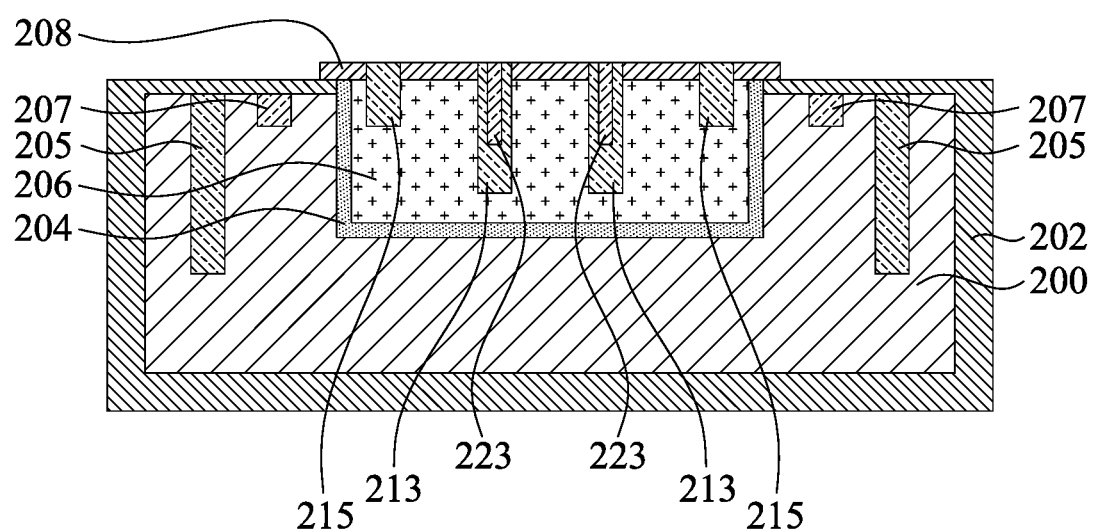

FIG. 2G through FIG. 2L are cross-sectional views of intermediate stages of a method for fabricating an image sensor 10 in accordance with some embodiments of the present disclosure. Referring from FIGS. 2G to 2K, after the formation of the capping layer 208, first n-type wells 213 are formed in the epitaxial structures 206 and the capping layer 208. Thereafter, second n-type wells 215 shallower than first n-type wells 213 are formed in the epitaxial structure 206 and the capping layer 208 in which the first n-type wells 213 are between the second n-type wells 215. Next, as shown in FIG. 2K, p-type wells 223 are respectively formed in the first n-type wells 213 to form a p-n junction. The first n-type wells 213 and the second n-type wells 215 are doped with N-type dopants such as arsenic or phosphorous, and the p-type wells 223 are doped with P-type dopants such as boron, but embodiments of the present disclosure are not limited in this respect.

Figure 2L:
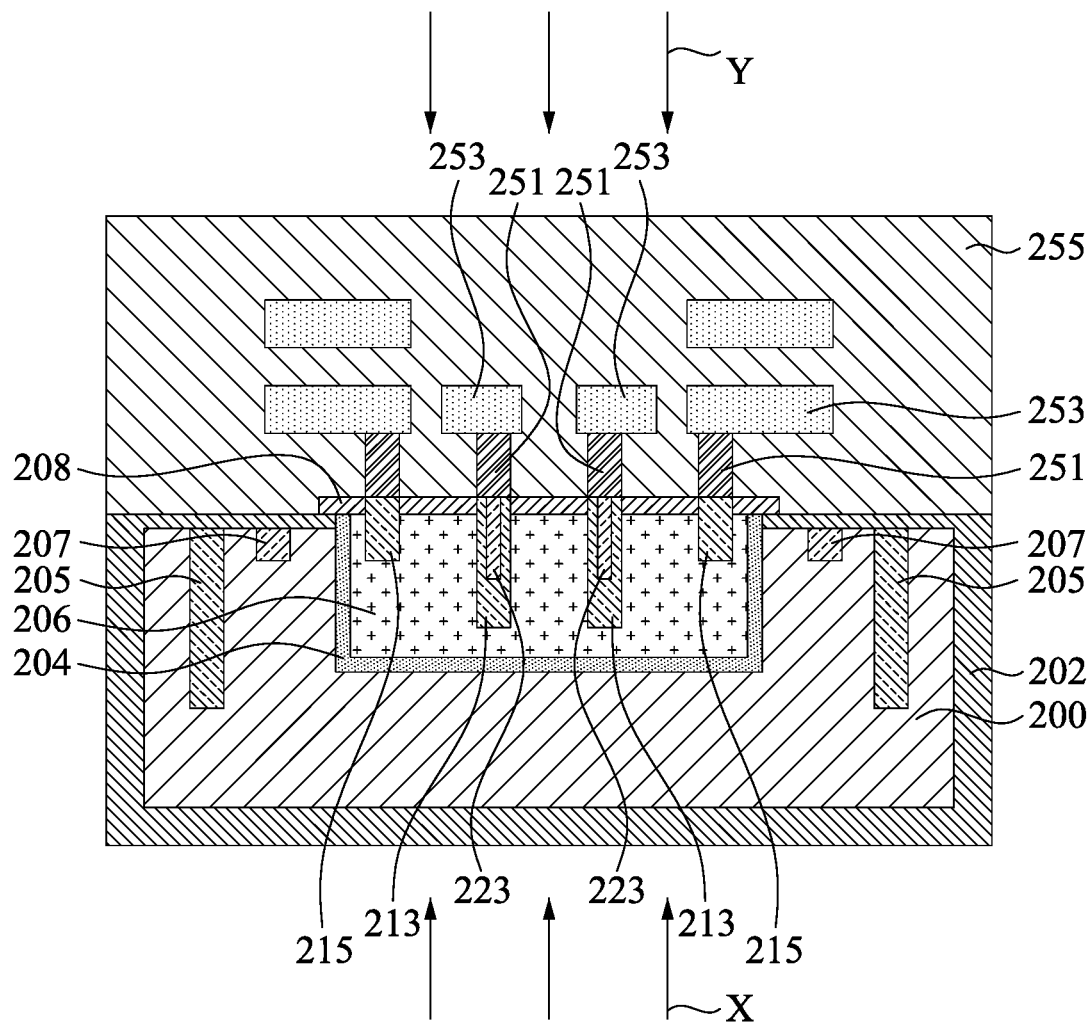

Referring to FIG. 2K and FIG. 2L, after the formation of the p-type wells 223, a dielectric layer 255, conductive vias 251, and conductive structures 253 are formed over the capping layer 208 and the insulating layer 202. The formation of the dielectric layer 255, the conductive vias 251, and the conductive structures 253 includes forming a first dielectric layer over the capping layer 208 and the insulating layer 202, forming a through hole to expose a portion of the capping layer 208, filling the through hole with a first conductive material to form the conductive vias 251, forming a second conductive layer over the first dielectric layer and the conductive vias 251, patterning the second conductive material to form the conductive structures 253 (e.g., a redistribution line), and forming a second dielectric layer over the conductive structures 253 and the first dielectric layer. The plural dielectric layers form the dielectric layer 255 of FIG. 2L. The conductive vias 251 are respectively electrically connected to the first n-type wells 213 and second n-type wells 215. In some embodiments of the present disclosure, the first dielectric layer may be the same as the second dielectric layer, and thus there is no interface there between. The first conductive material may be different from the second conductive material, and thus there is an interface between the conductive vias 251 and the conductive structures 253. As a result, the image sensor 10 of FIG. 2L can be obtained. In some embodiments, the conductive vias 251 and the conductive structures 253 are located in the dielectric layer 255. The conductive vias 251 are located on the capping layer 208, and the conductive structures 253 are respectively located on the conductive vias 251. In some embodiments, the conductive vias 251 can include tungsten (W), cobalt (Co), or the alloy thereof, and the conductive structure 253 can include copper (Cu), silver (Ag), gold (Au), aluminum (Al), or the alloy thereof. In some embodiments, the conductive vias 251, the conductive structures 253, and the dielectric layer 255 can be formed by using a deposition process such as, for example, chemical vapor deposition (CVD), plasma enhanced chemical vapor deposition CVD (PECVD), physical vapor deposition (PVD), or other suitable deposition processes.

FIG. 2L is a cross-sectional view of the image sensor 10 in accordance with some embodiments of the present disclosure. Referring to FIG. 2L, the image sensor 10 includes the semiconductor substrate 200, the insulating layer 202, and the epitaxial structure 206. The insulating layer 202 surrounding the semiconductor substrate 200. The epitaxial structure 206 is in the semiconductor substrate 200. A top surface of the epitaxial structure 206 is lower than a top surface of the insulating layer 202, and the step height H (see FIG. 2F) between the top surface of the epitaxial structure 206 and the top surface of the insulating layer 202 is in a range from about 0 Å to about 100 Å. The epitaxial structure 206 has a bottom surface and a sidewall surrounding the bottom surface, and an angle between the bottom surface and the sidewall is in a range from about 90 degrees to about 110 degrees. In some embodiments, the buffer layer 204 is disposed between the semiconductor substrate 200 and the epitaxial structure 206 to prevent the dislocation thereof. In alternative embodiments, the epitaxial structure 206 may be in contact with the semiconductor substrate 200. The capping layer 208 is over the top surface of the epitaxial structure 206 and the top surface of the insulating layer 202, so that the epitaxial structure 206 can be covered and protected by the capping layer 208. Furthermore, some of the conductive vias 251 are on the first n-type wells 213 and the p-type wells 223, and the other conductive vias 251 are respectively on the second n-type wells 215. The conductive structures 253 are located on the conductive via 251. The dielectric layer 255 is formed on the insulating layer 202 and the capping layer 208, and the conductive vias 251 and the conductive structures 253 are within the dielectric layer 255.

According to the configuration of the image sensor 10 in FIG. 2L, the epitaxial structure 206 of the image sensor 10 can receive light, and the light is then transferred into an electron by the p-n junction between the first n-type well 213 and the p-type well 223 due to photoelectric effect. The epitaxial structure 206 include germanium or alloy thereof, such that the image sensor 10 can sense near-infrared (NIR) as a time-of-flight (TOF) sensor. The capping layer 208 can protect the epitaxial structure 206 from interference while the conductive vias 251 and the conductive structures 253 transfer the electron from the epitaxial structure 206 in order to complete a process of image sensing.

As can be shown in FIG. 2L, an arrow X and an arrow Y respectively illustrate light passing in different directions. In some embodiments of the present disclosure, the epitaxial structure 206 can receive light in a direction of the arrow X, and thus the configuration of the image sensor 10 in FIG. 2L can serve as a back side illumination (BSI) image sensor in time-of-flight (TOF) applications. In some other embodiments of the present disclosure, the epitaxial structure 206 can receive light in a direction of the arrow Y, and thus the configuration of the image sensor 10 in FIG. 2L can serve as a front side illumination (FSI) image sensor in time-of-flight (TOF) applications.

Figure 3:
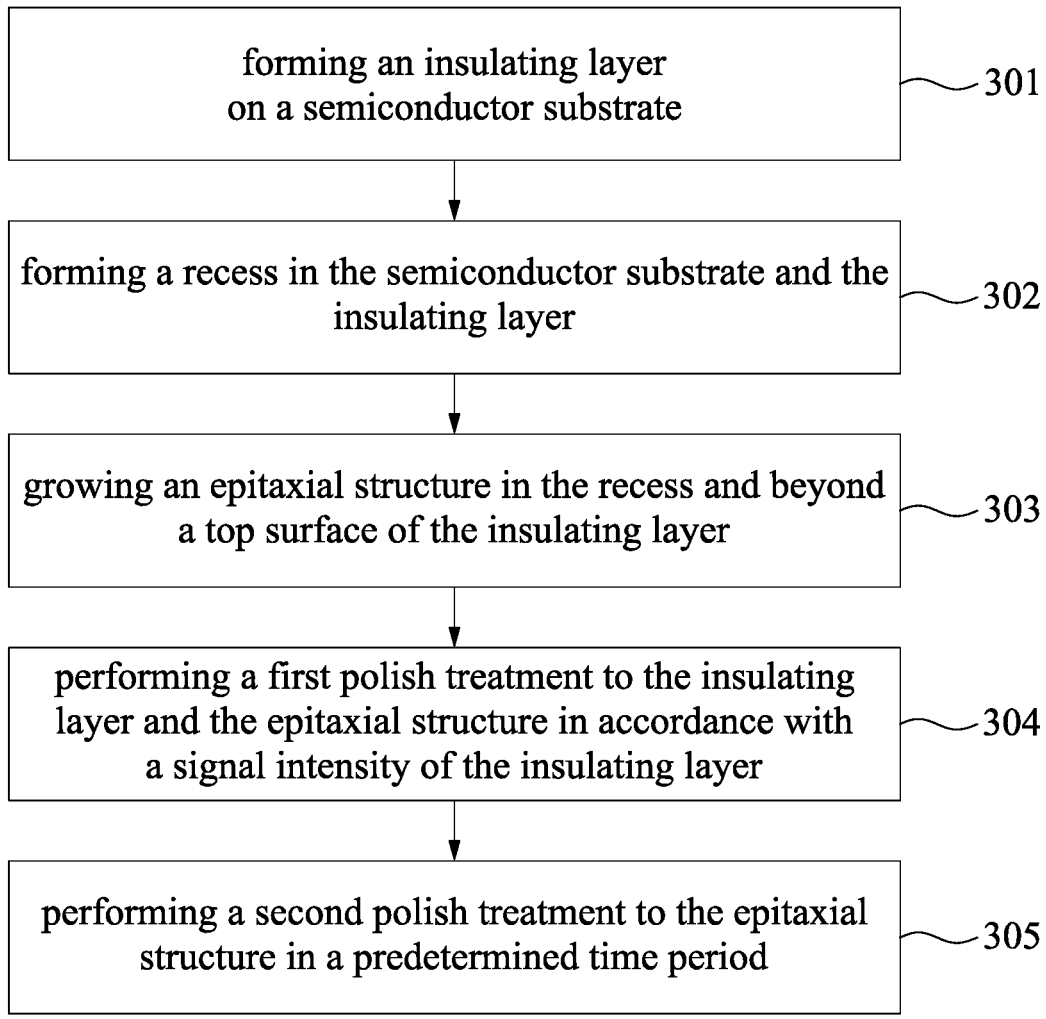
FIG. 3 is a flowchart of a method for fabricating an image sensor in accordance with some embodiments of the present disclosure.

FIG. 3 is a flowchart of a method 300 for fabricating an image sensor in accordance with some embodiments of the present disclosure. According to FIG. 3 and the above information, the method 300 begins with Step 301 in which an insulating layer is formed on a semiconductor substrate. The method 300 continues with Step 302 in which a recess is formed in the semiconductor substrate and the insulating layer. The method 300 continues with Step 303 in which an epitaxial structure is grown in the recess and beyond a top surface of the insulating layer. The method 300 continues with Step 304 in which a first polish treatment is performed to the insulating layer and the epitaxial structure in accordance with a signal intensity of the insulating layer. The method 300 continues with Step 305 in which a second polish treatment is performed to the epitaxial structure in a predetermined time period. The difference between the method 300 and the method 100 of FIG. 1 is that the first polish treatment and the second polish treatment are continuous in method 300. In contrast, the second polish treatment is performed after the first polish treatment stops in the method 100.

In Step 301, the semiconductor substrate can be a semiconductor crystalline substrate, such as a silicon substrate. The insulating layer is comprised of any suitable material, which is an oxide or a nitride of a semiconductor material, such as $SiO_2$ or $SiN_X$. Furthermore, the insulating layer can be formed by using a deposition process such as, for example, chemical vapor deposition (CVD), plasma enhanced chemical vapor deposition CVD (PECVD), physical vapor deposition (PVD), or other suitable deposition processes. Moreover, p-wells are formed in the semiconductor substrate and n-wells are formed between the p-wells, before the formation of the insulating layer. The p-wells are deeper than the n-wells in the semiconductor substrate.

In Step 302, a recess in the semiconductor substrate is formed between the n-wells by etching the insulating layer and the semiconductor substrate, and a side wall of the recess has a tilt angle in a range from about 70 degrees to about 90 degrees. Moreover, a patterned mask and a photoresist layer can be used to form and control the recess, and any suitable etching process, such as a dry etching process, a wet etching process, or any aforementioned process, can be performed to partially remove semiconductor substrate and the partial insulating layer in order to form the recess.

In Step 303, a top surface of the epitaxial structure is higher than a top surface of the insulating layer. Moreover, the epitaxial structure can be a germanium-based material, such as intrinsic germanium or an alloy of elements including germanium. In addition, growing the epitaxial structure is such that a top surface of the epitaxial structure is higher than a top surface of the insulating layer.

Referring to FIG. 2D through FIG. 2F, FIG. 2D through FIG. 2F can diagrammatically illustrate Step 304 of FIG. 3. The difference between the method 300 and the method 100 of FIG. 1 is that the first polish treatment and the second polish treatment are continuous in method 300. In other words, a CMP tool which performs the first polish treatment does not need to stop while the first polish treatment is completed, and the CMP tool can perform the second polish treatment right after the first polish treatment. In Step 304, the signal intensity increases as a thickness of the insulating layer 202 decreases. Therefore, the first polish treatment is completed when the signal intensity reaches a target value corresponding to the desired thickness of the insulating layer 202, thereby acquiring the desired thickness of the insulating layer 202 and the epitaxial structure 206. After the first polish treatment, a step height H between a top surface of the insulating layer 202 and a top surface of the epitaxial structure 206 is in a range from about 0 Å to about 60 Å, and a thickness of the insulating layer 202 smaller than about 20 Å is removed. Specifically, performing the first polish treatment to the epitaxial structure 206 is such that a top surface of the insulating layer 202 is higher than or coplanar with a top surface of the epitaxial structure 206. The first polish treatment can be a CMP treatment, but embodiments of the present disclosure are not limited in this respect.

Referring to FIG. 2D through FIG. 2F, FIG. 2D through FIG. 2F can also diagrammatically illustrate Step 305 of FIG. 3. In Step 305, after the second polish treatment, a step height H between a top surface of the insulating layer 202 and a top surface of the epitaxial structure 206 is in a range from about 40 Å to about 100 Å. Therefore, a top surface of the insulating layer 202 is higher than a top surface of the epitaxial structure 206. Since polish time is relevant to the removed thickness of the epitaxial structure 206 and the insulating layer 202, the desired step height H can be obtained by adjusting polish time of the second polish treatment. Specifically, the second polish treatment can also be a CMP treatment, but embodiments of the present disclosure are not limited in this respect.

After Step 305, a capping layer can be formed over the epitaxial structure and the insulating layer. A thickness of the capping layer is equal to or less than 300 Å. A contact structure, a conductive structure, and a dielectric layer are grown on the capping layer. In addition, the contact structure and the conductive structure are within the dielectric layer.

In some embodiments, the first polish treatment is performed to the insulating layer and the epitaxial structure in accordance with a signal intensity of the insulating layer. Moreover, a target value about the signal intensity of the insulating layer can be predetermined, and the first polish treatment stops when the signal intensity reach the target value. Therefore, the thickness of the insulating layer and the epitaxial structure can be controlled more accurately, so as to acquire the desired step height thereof. In some other embodiments, a second polish treatment which is controlled by operation time period can be performed after the first polish treatment. Since polish time is relevant to the removed thickness of the epitaxial structure and the insulating layer, the desired step height can also be obtained by adjusting polish time of the second polish treatment. Hence, if the desired thickness and step height cannot be formed by the first polish treatment, the second polish treatment can make up. In addition, kill defects over the insulating layer and the epitaxial structure can be prevented by not only the first polish treatment but also the second polish treatment.

According to some embodiments, a method for fabricating an image sensor starts with a first step in which an insulating layer is formed on a semiconductor substrate. The method continues with a second step in which a recess is formed in the semiconductor substrate and the insulating layer. The method continues with a third step in which an epitaxial structure is grown in the recess. The method continues with a fourth step in which a first polish treatment is performed to the insulating layer and the epitaxial structure. The method continues with a fifth step in which a thickness of the insulating layer is detected to obtain a signal intensity, and the signal intensity increases as a thickness of the insulating layer decreases. The method continues with a sixth step in which the first polish treatment stops when the signal intensity reaches a target value.

According to some embodiments, a method for fabricating an image sensor starts with a first step in which an insulating layer is formed on a semiconductor substrate. The method continues with a second step in which a recess is formed in the semiconductor substrate and the insulating layer. The method continues with a third step in which an epitaxial structure is grown in the recess and beyond a top surface of the insulating layer. The method continues with a fourth step in which a first polish treatment is performed to the insulating layer and the epitaxial structure in accordance with a signal intensity of the insulating layer. The method continues with a fifth step in which a second polish treatment is performed to the epitaxial structure in a predetermined time period.

According to some embodiments, an image sensor includes a semiconductor substrate, and an insulating layer, and an epitaxial structure. The insulating layer surrounding the semiconductor substrate. The epitaxial structure in the semiconductor substrate, wherein a top surface of the epitaxial structure is lower than a top surface of the insulating layer, and a step height between the top surface of the epitaxial structure and the top surface of the insulating layer is in a range from about 0 Å to about 100 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not de depart from the spirit and scope of the present disclosure, and that they may make various changes, substitutions, and alterations herein without departing from the spirit and scope of the present disclosure.

What is claimed is:

1. A method for fabricating an image sensor comprising:
   forming an insulating layer on a semiconductor substrate;
   forming a recess in the semiconductor substrate and the insulating layer;
   growing an epitaxial structure in the recess;
   performing a first polish treatment to the insulating layer and the epitaxial structure;
   detecting a thickness of the insulating layer to obtain a signal intensity, wherein the signal intensity increases as the thickness of the insulating layer decreases; and
   stopping the first polish treatment when the signal intensity reaches a target value.

2. The method of claim 1, wherein after the first polish treatment is stopped, a step height between a top surface of the insulating layer and a top surface of the epitaxial structure is in a range from about 0 Å to about 60 Å.

3. The method of claim 1, wherein forming the recess in the semiconductor substrate comprises:
   etching the insulating layer and the semiconductor substrate to form the recess, wherein a sidewall of the recess has a tilt angle in a range from about 70 degrees to about 90 degrees.

4. The method of claim 1, further comprising:
   forming a capping layer over the epitaxial structure and the insulating layer.

5. The method of claim 1, wherein growing the epitaxial structure is such that a top surface of the epitaxial structure is higher than a top surface of the insulating layer.

6. The method of claim 1, wherein the epitaxial structure is a germanium-based material.

7. The method of claim 1, further comprising:
   after the first polish treatment, performing a second polish treatment to the epitaxial structure in a predetermined time period.

8. The method of claim 7, wherein performing the second polish treatment is such that a step height between a top surface of the insulating layer and a top surface of the epitaxial structure is in a range from about 40 Å to about 100 Å.

9. A method for fabricating an image sensor comprising:
   forming an insulating layer on a semiconductor substrate;

forming a recess in the semiconductor substrate and the insulating layer;

growing an epitaxial structure in the recess and beyond a top surface of the insulating layer;

performing a first polish treatment to the insulating layer and the epitaxial structure in accordance with a signal intensity of a thickness of the insulating layer; and performing a second polish treatment to the epitaxial structure in a predetermined time period.

10. The method of claim 9, further comprising:

detecting the insulating layer to obtain the signal intensity during performing the first polish treatment.

11. The method of claim 9, wherein the signal intensity increases as the thickness of the insulating layer decreases, the method further comprising:

stopping the first polish treatment when the signal intensity reaches a target value.

12. The method of claim 9, wherein performing the first polish treatment to the epitaxial structure is such that the top surface of the insulating layer is higher than or coplanar with a top surface of the epitaxial structure.

13. The method of claim 9, wherein performing the second polish treatment is such that the top surface of the insulating layer is higher than a top surface of the epitaxial structure.

14. The method of claim 9, wherein growing the epitaxial structure in the recess is such that an obtuse angle is formed between a bottom surface and a sidewall of the epitaxial structure.

15. The method of claim 9, further comprising:

forming a capping layer over the epitaxial structure and the insulating layer.

16. The method of claim 9, wherein performing the first polish treatment comprises:

removing the thickness of the insulating layer smaller than about 20 Å.

17. A method for fabricating an image sensor comprising:

forming an insulating layer on a semiconductor substrate;

etching the insulating layer and the semiconductor substrate to form a recess in the semiconductor substrate;

growing an epitaxial structure in the recess and beyond a top surface of the insulating layer;

performing a first polish treatment to the epitaxial structure and the insulating layer, wherein the first polish treatment comprises an end point detection that detects a thickness of the insulating layer;

forming first n-type wells in the epitaxial structure;

forming second n-type wells in the epitaxial structure, wherein each of the second n-type wells is spaced apart from each of the first n-type wells; and forming p-type wells respectively in the first n-type wells.

18. The method of claim 17, further comprising:

after performing the first polish treatment and prior to forming the first n-type wells, performing a second polish treatment to the epitaxial structure, wherein the second polish treatment uses a time mode.

19. The method of claim 17, wherein forming the first n-type wells and forming the second n-type wells are performed such that each of the second n-type wells is shallower than each of the first n-type wells.

20. The method of claim 17, further comprising:

after performing the first polish treatment and prior to forming the first n-type wells, forming a capping layer on the epitaxial structure and the top surface of the insulating layer.

* * * * *